United States Patent [19]

Wu

[11] Patent Number: 5,151,374
[45] Date of Patent: Sep. 29, 1992

[54] METHOD OF FORMING A THIN FILM FIELD EFFECT TRANSISTOR HAVING A DRAIN CHANNEL JUNCTION THAT IS SPACED FROM THE GATE ELECTRODE

[75] Inventor: Neng-Wei Wu, Hsinchu, Taiwan

[73] Assignee: Industrial Technology Research Institute, Hsinchu, Taiwan

[21] Appl. No.: 735,086

[22] Filed: Jul. 24, 1991

[51] Int. Cl.⁵ .................................. H01L 21/265
[52] U.S. Cl. ........................... 437/40; 437/29; 437/41; 437/44; 437/52; 148/DIG. 150
[58] Field of Search ............ 437/46, 29, 40, 41, 437/44, 84, 52, 56; 148/DIG. 50

[56] References Cited

U.S. PATENT DOCUMENTS

| | | | |
|---|---|---|---|
| 3,933,529 | 1/1976 | Goser | 437/56 |
| 4,050,965 | 9/1977 | Ipri et al. | 437/84 |
| 4,160,260 | 7/1979 | Weitzel | 148/DIG. 150 |
| 4,619,034 | 10/1986 | Janning | 437/52 |
| 4,753,896 | 6/1988 | Matloubian | 437/29 |
| 4,946,799 | 8/1990 | Blake et al. | 437/29 |
| 4,992,392 | 2/1991 | Nichols et al. | 437/27 |
| 4,997,779 | 3/1991 | Kohno | 437/235 |
| 5,036,017 | 7/1991 | Noda | 437/912 |

FOREIGN PATENT DOCUMENTS

| | | | |
|---|---|---|---|
| 0206163 | 12/1983 | Japan | 437/29 |
| 2038088 | 7/1980 | United Kingdom | 437/29 |

*Primary Examiner*—Brian E. Hearn
*Assistant Examiner*—Michael Trinh

[57] ABSTRACT

A process for forming a thin film field effect transistor, particularly adapted for use in SDRAM devices using CMOS flip-flop circuits, wherein the transistor has a drain-channel P-N junction that is precisely spaced from the gate electrode, the process involving the etch back of the edge of the gate electrode, either prior to ion implantation to form the source and drain, or following the implantation.

19 Claims, 4 Drawing Sheets

5,151,374

METHOD OF FORMING A THIN FILM FIELD EFFECT TRANSISTOR HAVING A DRAIN CHANNEL JUNCTION THAT IS SPACED FROM THE GATE ELECTRODE

BACKGROUND OF THE INVENTION

1. Field of the Invention

The present invention relates to an improved semiconductor device, and more particularly to a method of forming a thin film transistor.

2. Description of the Prior Art

Many different types of semiconductor devices that can store binary information, or data in terms of electric charges, have been developed and are at present used in various computer memories. The list includes, static memories, dynamic memories, read only memories and the like. Semiconductor device memories are widely used because they have the capability of high integration density, and are relatively inexpensive. Among these memories, the static type semiconductor memory has found wide application as a random access memory (RAM), because it can retain stored data without periodic refresh operations.

The static random access memory (SRAM) can be implemented by a large number of flip-flop circuits, each of which stores one bit of information. CMOS flip-flop circuits, each normally composed of a pair of N-channel MOS field effect transistors, and a pair of P-channel MOS field effect transistors, are widely utilized as memory cells because power consumption of the device is very low. However, initially CMOS flip-flop memories necessitated a relatively large area on a semiconductor substrate, making high integration density difficult to attain.

A general circuit structure of the CMOS type static memory cell may be understood by reference to U.S. Pat. No. 4,980,732 and is shown in FIG. 1. In FIG. 1, N-channel MOS transistors QN1, QN2 and P-channel MOS transistors QP1 and QP2 form a CMOS flip-flop circuit in which the transistors QP1 and QN1 having electrically common gates G1 form a first CMOS inverter, and the transistors QP2 and QN2 having electrically common gates G2 form a second CMOS inverter. Output nodes N1 and N2 of the first and second CMOS inverters are connected to a pair of digit lines DL and SL, via a pair of N-channel transfer gate transistors QN3 and QN4, controlled by a word line, WL.

In order to reduce the area that each CMOS circuit occupied on the device, it was proposed to form a pair of P-channel MOS transistors as thin film transistors (TFTS), such as silicon-on-insulator (SOI) structure, with the other pair of N-channel transistors formed in the body of the device. With this structure, the P-channel transistors can overlap a part of the N-channel MOS transistors, and therefore the integration scale of the SRAM is enlarged.

An example of how a thin film transistor is embodied in a CMOS structure is illustrated in FIG. 2. In FIG. 2, a P-type silicon substrate 10 is overlaid with a gate insulator film 16, on which a gate electrode 14 of polycrystalline silicon is formed. In silicon substrate 10 on both sides of the gate electrode 14, N-type diffused regions 14A and 14B at an impurity concentration of between $10^{20}$ and $10^{21}$ $Cm^{-3}$ are formed as source and drain regions of transistor QN1. The gate electrode 14 and the N-type diffused regions 14A, 14B constitute the N-channel transistor QN1 in FIG. 1. Accordingly, the N-type diffused region 14A is connected to the ground potential. In FIG. 2, a gate insulator film 17 is formed on the gate electrode 14, and an N-type silicon thin film 13 is formed on the gate insulator films 16 and 17. P-type diffused region 13S and 13D of an impurity concentration of between $10^{19}$ and $10^{21}$ $Cm^{-3}$ are formed in the parts of the silicon thin film 13 on both the sides of the gate electrode 14, and the P-channel transistor QP1 in FIG. 1 is formed by the SOI structure by the gate electrode 14 and the P-type diffused regions 13S, 13D. The P-type diffused layer 13S is connected to power source potential Vcc by a lead out electrode 11 composed of aluminum. The P-type diffused layer 13D and the N-type diffused region 14B are connected by a conductive layer 18 of aluminum at node N1. Symbols 12A, 12B and 12C denote thick insulator films, and numeral 15 denotes a port of gate electrode G2 of the second inverter which is formed of P-channel transistor QP2 and N-channel transistor QN2 in FIG. 1.

However, the crystalline characteristics of the polycrystalline silicon film, or the monocrystalline silicon film formed on the semiconductor substrate over an insulating layer is not good, and a P-N junction formed in the silicon film is very leaky. Therefore, power consumption, that is standby current of the SRAM employing the aforementioned SOI type transistors, is relatively large.

A solution to reduce the leakage in a polycrystalline silicon layer of a thin film transistor is set forth in U.S. Pat. No. 4,980,732 and is illustrated in FIG. 3. In FIG. 3 the elements corresponding to the elements shown in FIG. 2 are denoted by the same reference numerals. Note that the P-N junction 20 between the channel region 13 and drain region 13D is spaced from the gate electrode 14. In contrast, corresponding P-N junction 19 in FIG. 2 is directly above gate electrode 14. This space between the channel and the drain reduces the Gate-induced Drain Leakage which is caused by the band-to-band tunneling in the gate overlap region of the drain.

As is believed apparent, the locating of the blocking mask for ion implanting the impurities into the polycrystalline film that forms the source and drain regions of the transistor is very exacting. The accuracy of defining the geometry of offset region is limited by the overlay accuracy of photo lithography process which could be large compared with its typical value.

FIG. 4 illustrates a modification of the structure shown in FIG. 3 as given in the U.S. Pat. No. 4,980,732. In FIG. 4 the elements corresponding to the elements shown in FIG'S. 2 and 3 are denoted by the same reference numerals. FIG. 4 illustrates a different placement of the thin film P-channel transistor, i.e. over a thick oxide layer 16A. Gate electrode 19 is provided which is electrically connected to gate 14 of the N-channel transistor.

SUMMARY OF THE INVENTION

It is therefor an object of the present invention to provide an improved method for forming a thin film transistor having improved current leakage characteristics.

Another object of the present invention is to provide a new method of fabricating a SRAM device utilizing CMOS flip-flop circuit with thin film transistors.

The method of the invention is for forming thin film field effect transistors and is accomplished in fabricating SRAM devices using CMOS flip-flop circuits with thin film transistors. A first thin polycrystalline silicon film is deposited on a semiconductor substrate. Then an insulating gate layer is deposited over the polycrystalline silicon film. A second polycrystalline silicon gate film is formed. An overlying second insulating layer over the insulating gate layer is formed. The composite layer is shaped to define the desired gate electrode. Impurity ions are introduced into the first polycrystalline silicon film by ion bombardment. The second insulating layer is used as a mask. The edge of the second polycrystalline silicon film is subsequently etched back over the channel-drain P-N junction.

BRIEF DESCRIPTION OF THE DRAWINGS

The above and further objects, features and advantages of the present invention will become more apparent from the following detailed description taken in conjunction with the drawings, wherein.

DETAILED DESCRIPTION OF THE INVENTION

Figure 1:
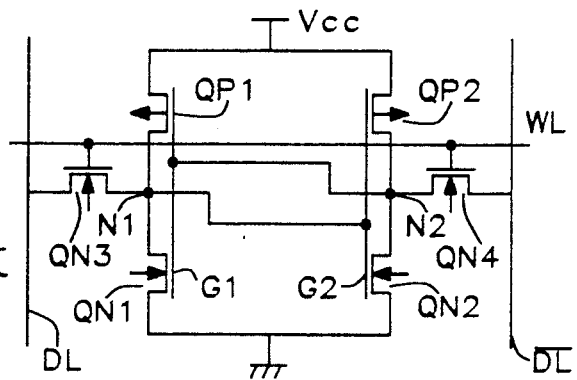
FIG. 1 is a schematic circuit diagram of CMOS static memory cell of the Prior Art.
Figure 2:
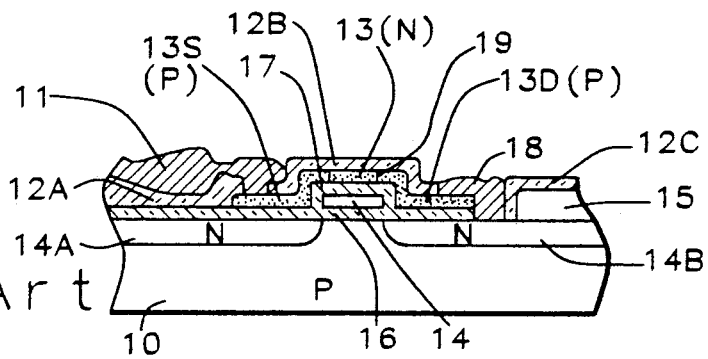
FIGS. 2 and 3 are schematic, cross-sectional views of a portion of a CMOS static memory cell, known to the Prior Art.
Figure 3:
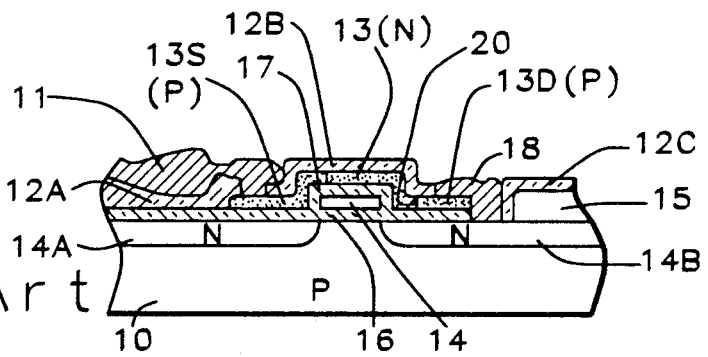
Figure 4:
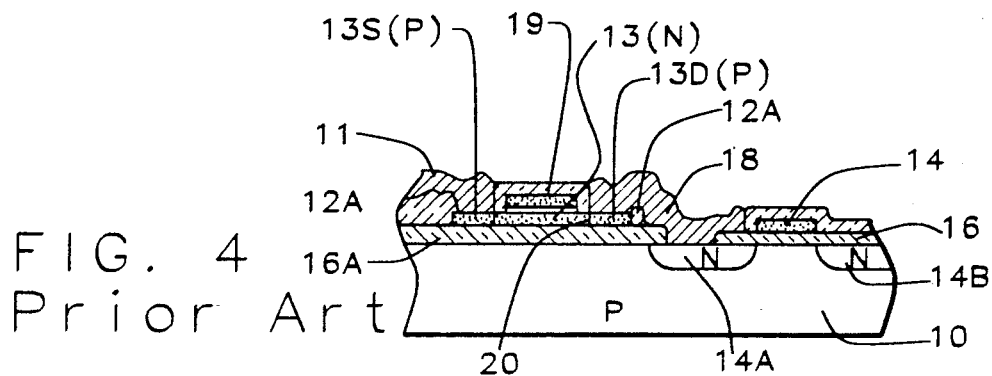
FIG. 4 is a schematic, cross-sectional view of a portion of an improved CMOS static memory cell, known to the Prior Art.
Figure 5:
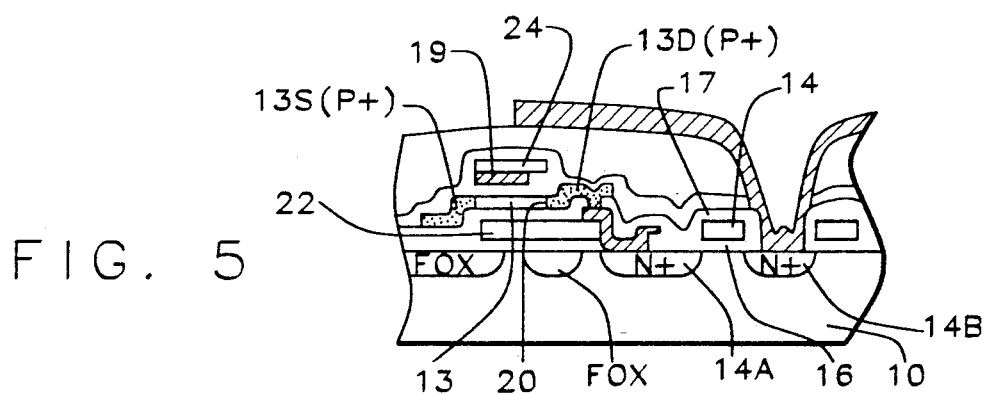
FIG. 5 is a schematic cross-sectional view of a portion of a CMOS static memory cell formed by the method of the invention.

Referring now more particularly to FIG. 5, there is illustrated a typical SRAM device fabricated with a thin film field effect transistor having a drain-channel junction 20 that is spaced from the gate electrode 19. The elements in FIG. 5 are indicated with the same reference numerals assigned to corresponding elements in FIGS. 2, 3 and 4. The P-channel thin film transistor is positioned over a relatively thick polycrystalline layer 22 that functions as a gate electrode of an NMOS transistor (not fully shown) and functions in the SRAM circuit as a driver. An insulating layer 24 over gate electrode serves as a blocking mask during an ion implantation step, as will become evident in the description that follows.

Referring now more particularly to FIGS. 6 through 9, there is depicted applicant's novel process for forming a displaced channel-drain junction in a thin film transistor. The transistor is located on any suitable and convenient area on the substrate, for example in the location indicated in FIG. 5. The previous fabrication steps used to build the SRAM cell are well known, and will not be described. In the process, a first thin layer 13 of polycrystalline silicon is deposited over a suitable insulating layer on the substrate. Layer 13 preferably has a thickness in the range of about 5 to 100 nanometers. An insulating layer 28 is deposited over layer 13 which will serve as a gate insulation layer in the completed transistor. Layer 28 is preferably composed of silicon nitride, silicon oxide or a combination of both oxides and nitrides and having a thickness in the range of about 10 to 60 nanometers. It is preferably formed by conventional low pressure chemical vapor deposition techniques which are known in the art.

A second polycrystalline silicon layer 30 is deposited over layer 28, preferably having a thickness in the range of about 50 to 200 nanometers. A masking layer 24 is deposited over layer 30 and the composite layers shaped or patterned by conventional lithography and etching techniques to form a gate electrode over the polycrystalline layer 13. Masking layer 24 has a thickness in excess of the thickness of layer 28, preferably in the range of about 50 to 100 nanometers. Layer 24 is preferably formed of silicon oxide deposited by conventional low pressure chemical vapor deposition as is known by those skilled in the art.

Figure 7:
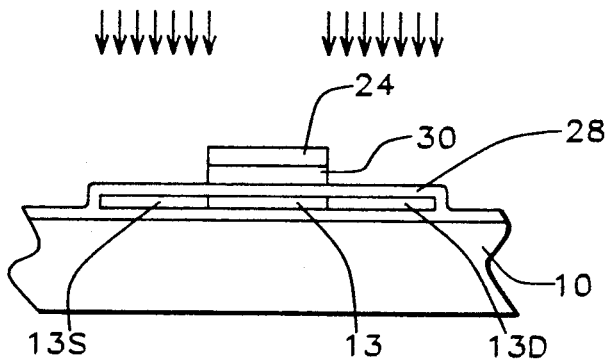

As shown in FIG. 7 the aforedescribed structure is bombarded with impurity ions to form the source region 13S and drain region 13D. When fabricating a P-channel transistor, the ion implantation process implants boron difluoride preferably with a dosage of about 1 E 15 and an acceleration voltage of about 25 KEV. The composite layer formed of layers 24 and 30 form a block to prevent implantation of impurity ions in the channel region of polycrystalline silicon layer 13.

Figure 8:
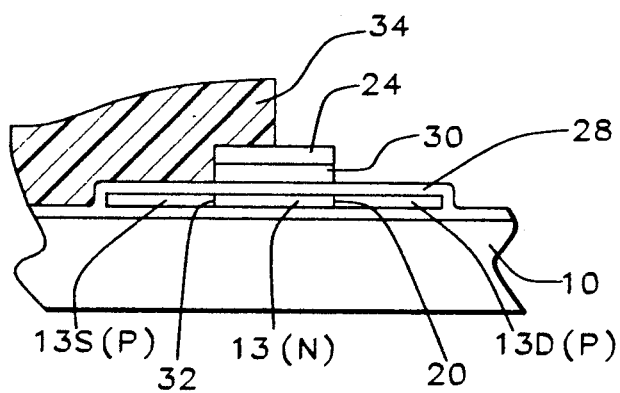
Figure 9:
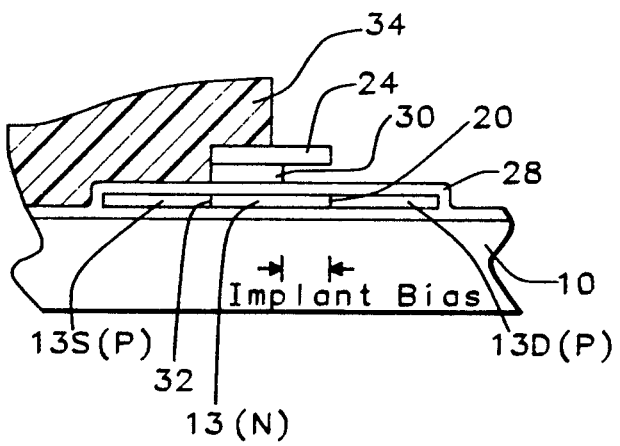

As shown in FIG. 8, a resist masking layer 34 is deposited to cover at least the edge of layer 30 over the source-channel junction, but leaving the opposite edge over the drain-channel junction 20 exposed. As shown in FIG. 9, the exposed edge of polycrystalline layer 30 is then etched back to displace the resultant edge back away from junction 20. Preferably the etch back is achieved by an isotropic dry etching process using sulfur hexafluoride using conventional dry etching equipment and conditions. Preferably the etch back distance of layer 13 is in the range of about 0.2 to 0.6 nanometers. The device is then completed using known fabrication techniques.

Figure 6:
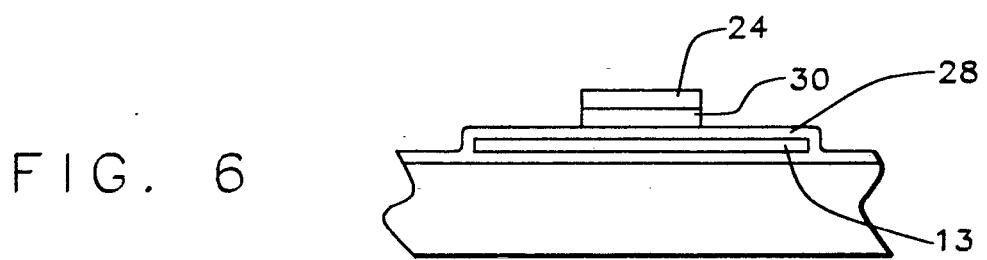
FIGS. 6 through 9 are a series of schematic cross-sectional views that illustrate a first embodiment of the method of the present invention.
Figure 10:
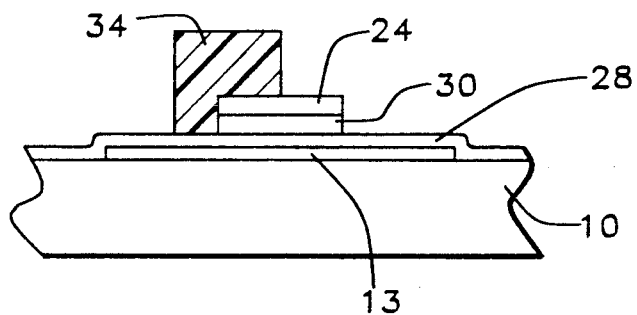
FIGS. 10 through 12 are a series of schematic cross-sectional views that, when taken with FIG. 6, illustrate a second embodiment of the method of the present invention.
Figure 11:
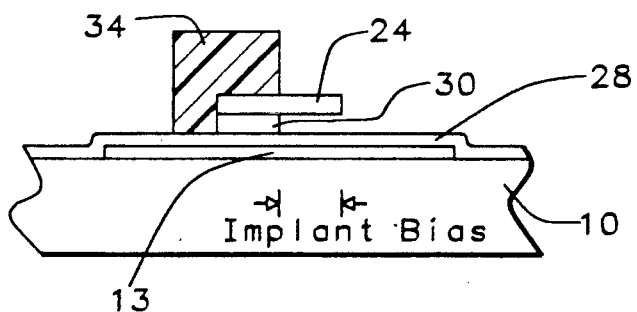
Figure 12:
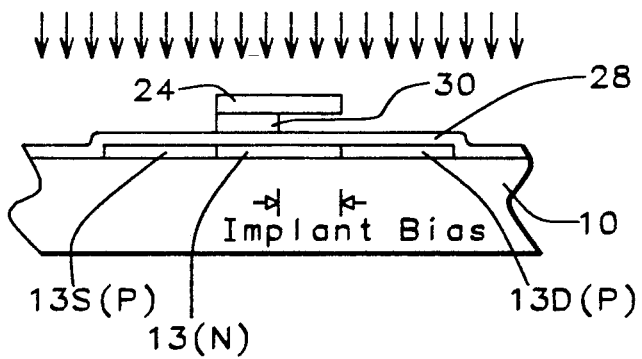

Referring now more particularly to FIG. 6 and FIGS. 10 through 12, there is illustrated a second embodiment of the method of the invention. The structure shown in FIG. 6 is fabricated using the steps previously described. Resist masking layer 34 is then deposited, as shown in FIG. 10, in the manner previously described with reference to the first embodiment. The layer 30 is then etched back, as shown in FIG. 11, as described above. Subsequently, the resist mask 34 is removed, and the structure subjected to ion bombardment to form the source and drain regions 13S and 13D, as shown in FIG. 12.

Figure 13:
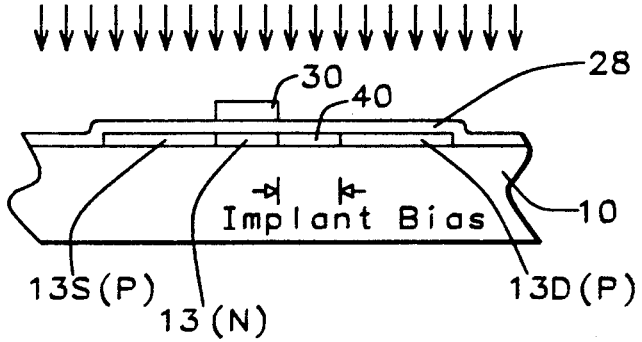
FIG. 13 illustrates an addition to the FIGS. 10 through 12 embodiment which allows a lightly doped offset structure to be formed.

Referring now particularly to FIG. 13, there is shown a modification of the FIGS. 10 through 12 process embodiment. The purpose of this modification is to lightly dope the offset at 40 to increase the current and reduce off current of the thin film transistor. The process modification involves the removal of the top silicon oxide layer 24 by conventional etching as with hydrofluoric acid solution after the lateral etching of the polysilicon layer. Then the ion implantation as illustrated in FIG. 13 is done with a moderate dosage of either Boron 11 or boron difluoride, such as between about 3 E 13 to 5 E 14 atoms per $cm^2$. To prevent the gate silicon oxide from being attacked during the top silicon oxide layer 24 removal, the gate dielectric under the second polysilicon has to be silicon nitride or a silicon nitride and silicon oxide composite.

The process of the invention provides a very precise control of the distance between the drain-channel junction and the edge of the gate electrode. This precise control is achieved without the use of precise masking steps, as was the case in the processes known to the prior art. The distance can be easily adjusted by the time of etch back.

Obviously, changes can be made in the process of the invention without departing from the spirit and scope of the invention, as for example, varying the nature of the implanted impurity, the choice of the various layers of the structure, the etch back of either P-N junction, or both, etc.

While the invention has been particularly shown and described with reference to the preferred embodiments thereof, it will be understood by those skilled in the art that various changes in form and detail may be made therein without departing from the spirit and scope of the invention.

What is claimed is:

1. A method of forming a thin film field effect transistor having a drain-channel P-N junction that is distanced from a gate electrode comprising:
   depositing a first thin polycrystalline silicon layer doped with a first type impurity for semiconductors over a first thin insulating layer on a monocrystalline silicon substrate;
   depositing a second thin insulating layer over the surface of said first polycrystalline silicon layer;
   forming a second polycrystalline silicon layer over at least said second insulating layer; depositing a third insulating layer over said second polycrystalline silicon layer;
   removing portions of said second polycrystalline silicon layer and overlying third insulating layer, leaving a gate area portion over a portion of the first polycrystalline silicon layer, the edges of the remaining portion of said second polycrystalline silicon layer being exposed;
   introducing second opposite type impurity ions into said first polycrystalline layer by ion bombardment to form source and drain regions therein, the remaining gate electrode area portion of said second polycrystalline silicon layer and said third overlying insulating layer forming a mask thereby preventing ions from penetrating the underlying area of said first polysilicon layer to form a channel region positioned between said source and drain regions and defined by the drain channel P-N junction and the source channel P-N junction;
   forming a masking layer that covers at least a portion of the edge of the second polycrystalline silicon layer over the source-channel P-N junction in said first polycrystalline silicon layer;
   etching back the exposed edge portion of said second polycrystalline silicon layer above the drain-channel P-N junction in said first polycrystalline silicon 5 layer; and
   removing said masking layer and forming an overlying insulating layer over the surface of the resultant device.

2. The method of claim 1 wherein said third insulating layer is a low pressure deposited silicon oxide layer having a thickness in excess of said second insulating layer.

3. The method of claim 2 wherein said first polycrystalline layer has a thickness in the range of about 5 to 100 nanometers.

4. The method of claim 3 wherein said second insulating layer is a gate insulating layer having a thickness in the range of about 10 to 60 nanometers.

5. The method of claim 4 wherein said masking layer is a photoresist layer.

6. The method of claim 2 wherein said exposed edge portion of the second polycrystalline silicon layer is etched back a distance in the range of about 0.2 to 0.6 nanometers.

7. The method of claim 1 wherein the thin film transistor is embedded as an integral part of a static random access memory device having a plurality of CMOS flip-flop circuits.

8. The method of claim 7 wherein said CMOS circuits each embodies a thin film field effect transistor and an associated field effect transistor in the body of the substrate having a channel of an opposite type to that of the thin film transistor channel.

9. A method of forming a thin film field effect transistor having a drain-channel P-N junction that is distanced from a gate electrode comprising:
   depositing a first thin polycrystalline silicon layer doped with a first type impurity for semiconductors over a first thin insulating layer on a monocrystalline silicon substrate;
   depositing a second thin insulating layer over the surface of said first polycrystalline silicon layer;
   forming a second polycrystalline silicon layer over at least said second insulating layer;
   depositing a third insulating layer over said second polycrystalline silicon layer;
   removing portions of said second polycrystalline silicon layer and overlying third insulating layer, leaving a gate area portion over a portion of the first polycrystalline silicon layer, the edges of the remaining portion of said silicon polycrystalline silicon layer being exposed;
   forming a masking layer that covers at least a portion of the edge of the second polycrystalline silicon layer, but leaves the opposite edge exposed; etching back the exposed edge portion of said second polycrystalline silicon layer;
   removing the masking layer; and
   introducing second opposite type impurity ions into said first polycrystalline silicon layer by ion bombardment to form source and drain regions therein, the overlying third insulating layer forming a mask which prevents ions from penetrating said first polycrystalline silicon layer thereby forming a channel region, positioned between said source and drain regions and defined by the drain channel P-N junction and the source channel P-N junction;
   wherein the second polycrystalline layer forms the gate electrode with the edge thereof spaced from the drain-channel junction.

10. The method of claim 9 wherein said third insulating layer is a low pressure silicon oxide layer having a thickness in excess of said second insulating layer.

11. The method of claim 10 wherein said first polycrystalline layer has a thickness in the range of about 5 to 100 nanometers.

12. The method of claim 11 wherein said second insulating layer is a gate insulating layer having a thickness in the range of about 10 to 60 nanometers.

13. The method of claim 12 wherein said masking layer is a resist layer.

14. The method of claim 10 wherein said exposed edge portion of the second polycrystalline silicon layer is etched back a distance in the range of about 0.2 to 0.6 nanometers.

15. The method of claim 14 and further comprising removing said third insulating layer and forming a lightly doped offset region by implanting ions of said second opposite impurity of suitable dosage into said offset region.

16. The method of claim 15 wherein said first insulating layer is a composite of silicon oxide and silicon nitride.

17. The method of claim 16 wherein said dosage of suitable ions is between about 3 E 13 to 5 E 14 and are boron difluoride.

18. The method of claim 9 wherein the thin film transistor is embedded as an integral part of a static random access memory device having a plurality of CMOS flip-flop circuits.

19. The method of claim 18 wherein said CMOS circuits each embodies a thin film field effect transistor and an associated field effect transistor in the body of the substrate having a channel of a type opposite to the thin film transistor channel.

* * * * *